United States Patent
Ying et al.

(10) Patent No.: US 10,491,253 B2
(45) Date of Patent: Nov. 26, 2019

(54) REDUCING INTERFERENCE IN RADIO BROADCAST BANDS

(71) Applicant: AT&T Intellectual Property I, L.P., Atlanta, GA (US)

(72) Inventors: Goangshiuan Shawn Ying, Oakland, CA (US); Ronald Brost, San Ramon, CA (US); Edward Walter, Boerne, TX (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

(21) Appl. No.: 15/914,313

(22) Filed: Mar. 7, 2018

(65) Prior Publication Data

US 2019/0280723 A1    Sep. 12, 2019

(51) Int. Cl.

| H04M 11/06 | (2006.01) |
|---|---|
| H04M 19/00 | (2006.01) |
| H04B 1/10 | (2006.01) |
| H04B 3/487 | (2015.01) |
| H04B 1/04 | (2006.01) |
| H04M 3/34 | (2006.01) |
| H03F 1/34 | (2006.01) |
| H04B 1/00 | (2006.01) |

(52) U.S. Cl.
CPC .............. *H04B 1/1036* (2013.01); *H03F 1/34* (2013.01); *H04B 1/0057* (2013.01); *H04B 1/0475* (2013.01); *H04B 3/487* (2015.01); *H04M 3/34* (2013.01); *H04B 2001/1063* (2013.01)

(58) Field of Classification Search
None
See application file for complete search history.

(56) References Cited

U.S. PATENT DOCUMENTS

| 6,481,013 | B1 * | 11/2002 | Dinwiddie | H04N 7/104 348/552 |
|---|---|---|---|---|
| 6,637,030 | B1 * | 10/2003 | Klein | H04N 7/106 348/E7.05 |
| 7,295,621 | B2 * | 11/2007 | Verbin | H04L 27/2602 375/259 |
| 8,396,427 | B2 * | 3/2013 | Le Guillou | H04B 1/1036 455/136 |
| 8,842,223 | B2 * | 9/2014 | Takahashi | H04H 20/77 348/133 |
| 8,964,900 | B2 * | 2/2015 | Goto | H04N 5/50 375/316 |
| 9,014,291 | B2 | 4/2015 | Gao et al. | |
| 9,065,504 | B2 | 6/2015 | Kwon et al. | |
| 9,094,635 | B2 * | 7/2015 | Goto | H04L 27/2659 |
| 9,203,678 | B2 * | 12/2015 | Okamoto | H04B 1/28 |
| 9,344,126 | B2 * | 5/2016 | Takahashi | H04N 5/4401 |

(Continued)

*Primary Examiner* — Tuan A Tran

(57) ABSTRACT

In one example, the present disclosure describes a device, computer-readable medium, and method for reducing interference on the frequency modulation (FM) radio broadcast band from the G.fast protocol standard spectrum. For instance, in one example, a method includes delivering broadband service to a customer over a spectrum that overlaps with a frequency modulation radio broadcast band, and applying a notch filter to a target frequency of the frequency modulation radio broadcast band based on a profile that is customized for the customer, wherein the notch filter prevents the broadband service from using the target frequency during the delivering.

20 Claims, 5 Drawing Sheets

(56) References Cited

U.S. PATENT DOCUMENTS

| | | | |
|---|---|---|---|
| 9,362,959 B2 | 6/2016 | Kuipers et al. | |
| 9,473,339 B2 | 10/2016 | Liang et al. | |
| 9,544,423 B2 | 1/2017 | Wei | |
| 9,609,388 B2 * | 3/2017 | Laksono | H04N 7/163 |
| 9,774,367 B2 | 9/2017 | Yang et al. | |
| 9,800,739 B2 * | 10/2017 | Linney | H04M 11/062 |
| 2015/0138943 A1 | 5/2015 | Zasowski et al. | |
| 2015/0327184 A1 * | 11/2015 | Beattie, Jr. | H04N 21/2221 455/501 |
| 2015/0372783 A1 | 12/2015 | Pal et al. | |
| 2015/0372846 A1 | 12/2015 | Pal et al. | |
| 2016/0254973 A1 | 9/2016 | Joanny et al. | |
| 2017/0118350 A1 | 4/2017 | Linney et al. | |
| 2017/0126899 A1 * | 5/2017 | Linney | H04M 11/062 |
| 2017/0279634 A1 | 9/2017 | Horsley et al. | |

\* cited by examiner

300

| LOCATION X | |
|---|---|
| FREQUENCY | SIGNAL STRENGTH |
| 87.5 MHZ | MODERATE |
| 92.3 MHZ | STRONG |
| . . . | |
| 107.1 MHZ | VERY WEAK |

| LOCATION\CUSTOMER X | | |
|---|---|---|
| FREQUENCY | SIGNAL STRENGTH | NOTCH FILTER? |
| 87.5 MHZ | MODERATE | NO |
| 92.3 MHZ | STRONG | YES |
| . . . | | |
| 107.1 MHZ | VERY WEAK | NO |

FIG. 3B

REDUCING INTERFERENCE IN RADIO BROADCAST BANDS

The present disclosure relates generally to digital subscriber line technology, and relates more particularly to devices, non-transitory computer-readable media, and methods for reducing interference on the frequency modulation radio broadcast band from the G.fast protocol standard spectrum.

BACKGROUND

The G.fast digital subscriber line (DSL) protocol standard provides high-speed broadband service for local loops (i.e., physical links or circuits that connect from a demarcation point of a customer premises to the edge of a telecommunications service provider's network) that are shorter than approximately fifty meters. For instance, early versions of G.fast specified 106 megahertz (MHz) profiles, while later versions specified profiles up to 212 MHz and beyond.

SUMMARY

In one example, the present disclosure describes a device, computer-readable medium, and method for reducing interference on the frequency modulation (FM) radio broadcast band from the G.fast protocol standard spectrum. For instance, in one example, a method includes delivering broadband service to a customer over a spectrum that overlaps with a frequency modulation radio broadcast band, and applying a notch filter to a target frequency of the frequency modulation radio broadcast band based on a profile that is customized for the customer, wherein the notch filter prevents the broadband service from using the target frequency during the delivering.

In another example, a computer-readable medium stores instructions which, when executed by the processor, cause the processor to perform operations. The operations include delivering broadband service to a customer over a spectrum that overlaps with a frequency modulation radio broadcast band, and applying a notch filter to a target frequency of the frequency modulation radio broadcast band based on a profile that is customized for the customer, wherein the notch filter prevents the broadband service from using the target frequency during the delivering.

In another example, a method includes delivering broadband service to a customer over a spectrum that overlaps with a frequency modulation radio broadcast band, determining that application of a notch filter to a target frequency of the frequency modulation radio broadcast band will cause the delivering to fail to meet a service level agreement, wherein the notch filter is requested in a profile that is customized for the customer, and automatically streaming a radio station that broadcasts over the target frequency over the internet through an internet-enabled radio when the customer tunes the internet-enabled radio to the target frequency

BRIEF DESCRIPTION OF THE DRAWINGS

The teachings of the present disclosure can be readily understood by considering the following detailed description in conjunction with the accompanying drawings, in which:

FIG. 3A illustrates an example interference profile showing example frequency modulation frequencies used in an example location;

FIG. 3B illustrates an example frequency notching profile based on the interference profile illustrated in FIG. 3A;

To facilitate understanding, identical reference numerals have been used, where possible, to designate identical elements that are common to the figures.

DETAILED DESCRIPTION

In one example, the present disclosure provides a method, system, and non-transitory computer readable storage medium for reducing interference on the frequency modulation (FM) radio broadcast band from the G.fast protocol standard spectrum. As discussed above, the G.fast digital subscriber line (DSL) protocol standard provides high-speed broadband service for local loops (i.e., physical links or circuits that connect from a demarcation point of a customer premises to the edge of a telecommunications service provider's network) that are shorter than approximately fifty meters. For instance, early versions of G.fast specified 106 megahertz (MHz) profiles, while later versions specified profiles up to 212 MHz and beyond. This spectrum overlaps the FM broadcast band between 87.5 MHz and 108 MHz, and also overlaps various military and government radio services. As such, G.fast customers may experience interference from the G.fast spectrum when attempting to use local radio devices to access stations that broadcast over the FM band.

Examples of the present disclosure minimize the interference on the FM radio broadcast band from the G.fast spectrum by selectively applying notch filters to bands of the G.fast spectrum, such that the G.fast spectrum does not utilize the bands to which the notch filters are applied. These notch filters may be applied in bands that overlap with the frequency bands used by local radio stations to which the customer listens. The notch filters may be applied or removed on-demand, e.g., based upon customer request. By limiting the application of the notch filters to narrow bands of target frequencies that the customer may actually listen to, interference can be reduced in these bands with minimal impact on the bandwidth of the broadband service.

Although examples of the present disclosure are discussed within the context of the G.fast protocol standard, it will be appreciated that these examples could apply to any broadband service that is delivered over a spectrum that overlaps with all or part of the FM radio broadcast band.

Figure 1:
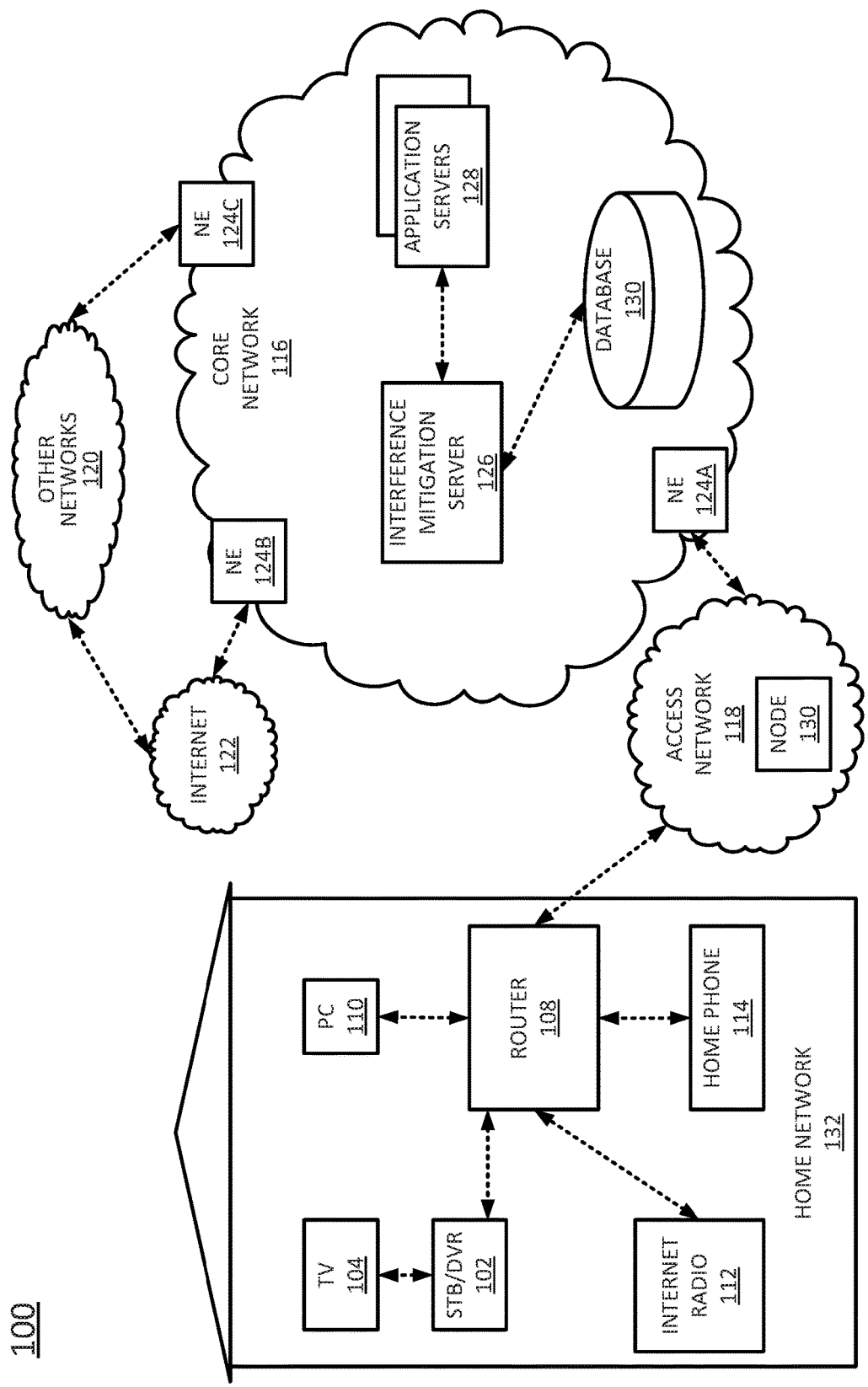
FIG. 1 illustrates an example content distribution network related to the present disclosure.

To better understand the present disclosure, FIG. 1 illustrates an example network 100, related to the present disclosure. As shown in FIG. 1, the network 100 may comprise a content distribution network (e.g., data network) that connects devices such as set-top boxes (STBs) 102, televisions (TVs) 104, routers 108, personal computers (PCs) 110, Internet radios 112, home telephones 114, other devices not pictured (such as mobile devices, smart home/Internet of Things (IOT) devices, and the like), and so forth, with one another and with various other devices via a core network 116, an access network 118, other networks 120 and/or the Internet 122. Devices such as set-top boxes (STBs) 102, televisions (TVs) 104, routers 108, personal computers (PCs) 110, Internet radios 112, home telephones 114, mobile devices, and other similar devices may also be referred to herein as "customer devices" or "user endpoint devices."

As illustrated in FIG. 1, network 100 includes a core network 116. In one example, core network 116 may combine core network components of a cellular network with components of a triple play service network; where triple play services include telephone services, Internet services, and television services to subscribers. For example, core network 116 may functionally comprise a fixed mobile convergence (FMC) network, e.g., an IP Multimedia Subsystem (IMS) network. In addition, core network 116 may functionally comprise a telephony network, e.g., an Internet Protocol/Multi-Protocol Label Switching (IP/MPLS) backbone network utilizing Session Initiation Protocol (SIP) for circuit-switched and Voice over Internet Protocol (VoIP) telephony services. Core network 116 may also further comprise a broadcast television network, e.g., a traditional cable provider network or an Internet Protocol Television (IPTV) network, as well as an Internet Service Provider (ISP) network. The network elements 124A-124C may serve as gateway servers or edge routers to interconnect the core network 116 with other networks 120, Internet 122, access network 118, and so forth. As shown in FIG. 1, core network 116 may also include an interference mitigation server 126, a plurality of application servers 128, and a database 130. For ease of illustration, various additional elements of core network 116 are omitted from FIG. 1.

The interference mitigation server 126 performs operations, discussed in greater detail below in connection with FIG. 2, related to reducing interference on the FM radio broadcast band from the G.fast protocol standard spectrum. The interference mitigation server 126 may perform these operations in connection with one or more frequency notching profiles, which may be stored in the database 130. As discussed in further detail below, the profiles may be location-specific, customer-specific, a combination of location- and customer-specific, or may be based on other criteria. That is, each broadband location served by the service provider, or each broadband customer served by the service provider, may have a customized profile that is different from the customized profiles of other broadband locations or broadband customers. For instance, the frequency notching profile for customer A may apply notch filters to target frequencies X and Y, while the frequency notching profile for customer B may apply notch filters to target frequencies X and Z.

Figure 5:
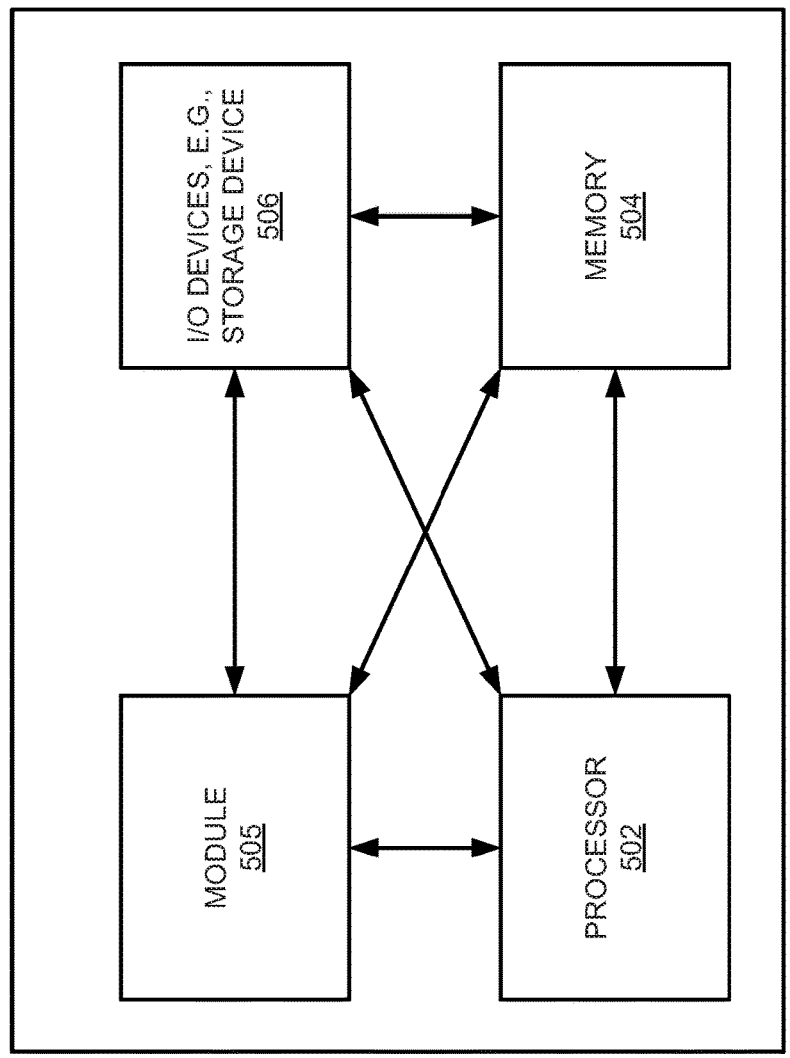
FIG. 5 depicts a high-level block diagram of a computing device specifically programmed to perform the functions described herein.

In one example, any or all of the interference mitigation server 126 or application servers 128 may comprise a computing system, such as computing system 500 depicted in FIG. 5.

In one example, the access network 118 may comprise a Digital Subscriber Line (DSL) network, a Local Area Network (LAN), a cellular or wireless access network, a 3$^{rd}$ party network, and the like. In this regard, access network 118 may include a node 130, e.g., a mini-fiber node (MFN), a video-ready access device (VRAD) or the like. However, in another example node 130 may be omitted, e.g., for fiber-to-the-premises (FTTP) installations. Access network 118 may also transmit and receive communications between home network 132 and core network 116 relating to communications with web servers via the Internet 122 and/or other networks 120, and so forth.

In one example, home network 132 may include a router 108, which receives data/communications associated with different types of media, e.g., television, phone, and Internet, and separates these communications for the appropriate devices. The data/communications may be received via access network 118, for instance. In one example, television data files are forwarded to set-top box (STB)/digital video recorder (DVR) 102 to be decoded, recorded, and/or forwarded to television (TV) 104 for presentation. Similarly, Internet communications are sent to and received from router 108, which may be capable of both wired and/or wireless communication. In turn, router 108 receives data from and sends data to the appropriate devices, e.g., personal computer (PC) 10, home phone 114, Internet radio 112, and/or other devices. Each of these devices may be configured to support media content of particular file formats. In one example, router 108 may further communicate with TV (broadly a display) 104, e.g., where the television 104 is a smart TV. TV 104 may also be configured to support media content of particular file formats. In one example, router 108 may comprise a wired Ethernet router and/or an Institute for Electrical and Electronics Engineers (IEEE) 802.11 (Wi-Fi) router, and may communicate with respective devices in home network 132 via wired and/or wireless connections.

It should be noted that as used herein, the terms "configure" and "reconfigure" may refer to programming or loading a computing device with computer-readable/computer-executable instructions, code, and/or programs, e.g., in a memory, which when executed by a processor of the computing device, may cause the computing device to perform various functions. Such terms may also encompass providing variables, data values, tables, objects, or other data structures or the like which may cause a computer device executing computer-readable instructions, code, and/or programs to function differently depending upon the values of the variables or other data structures that are provided.

Those skilled in the art will realize that the network 100 may be implemented in a different form than that which is illustrated in FIG. 1, or may be expanded by including additional endpoint devices, access networks, network elements, application servers, etc. without altering the scope of the present disclosure. For example, core network 116 is not limited to an IMS network. Similarly, the present disclosure is not limited to an IP/MPLS network for VoIP telephony services, or any particular type of broadcast television network for providing television services, and so forth.

Figure 2:
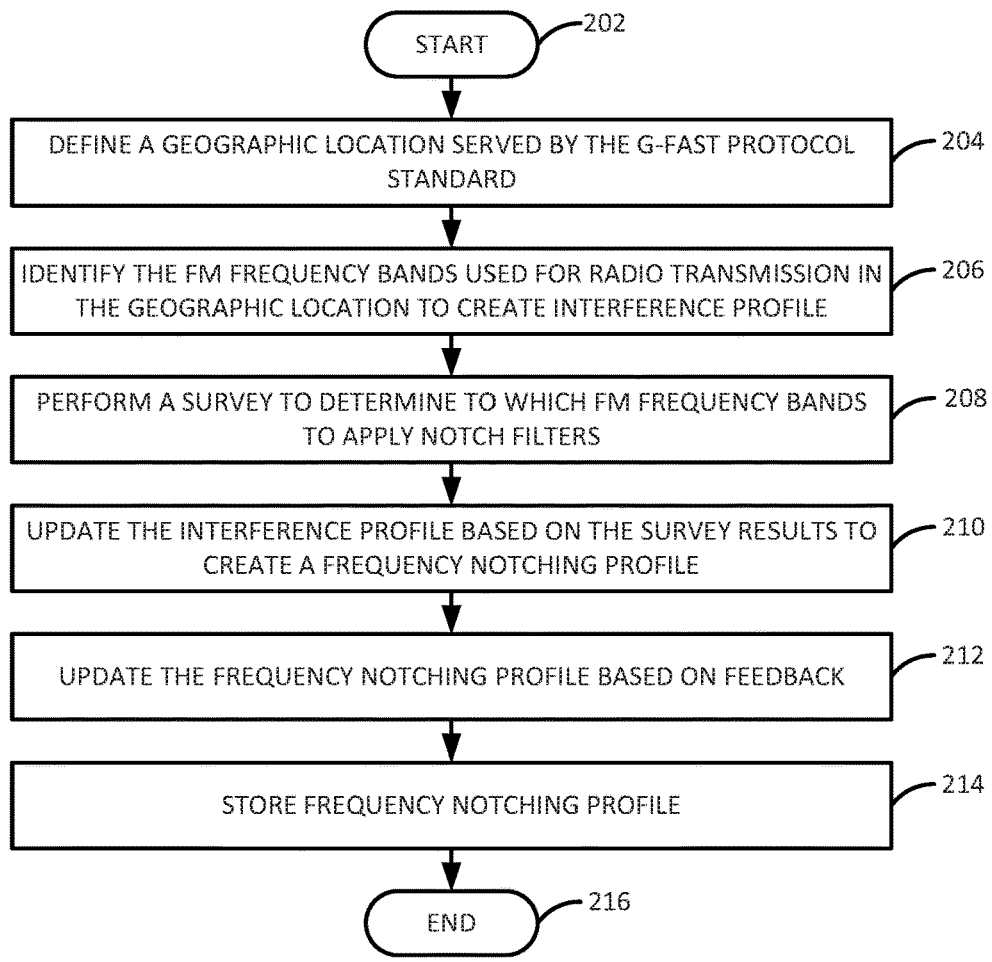
FIG. 2 illustrates a flowchart of an example method for creating a frequency notching profile.

To further aid in understanding the present disclosure, FIG. 2 illustrates a flowchart of an example method 200 for creating a frequency notching profile. In one example, the frequency notching profile may be used to determine, for a particular geographic location and/or customer, to which FM frequencies to apply a notch filter to minimize interference of broadband G.fast protocol standard service with local FM radio broadcasts (i.e., "target frequencies"). In one example, the method 200 may be performed by the interference mitigation server 126 and/or additional devices illustrated in FIG. 1. However, in other examples, the method 200 may be performed by another device or devices (e.g., one or more application servers 128 or other device(s)). As such, any references in the discussion of the method 200 to components of FIG. 1 are not intended to limit the means by which the method 200 may be performed.

The method 200 begins in step 202. In step 204, a geographic location served by the G.fast protocol standard service is defined. The geographic location may be defined, for example, as an area within a defined radius (e.g., x miles) from a particular set of geographic coordinates (e.g., latitude and longitude), as a particular town or zip code, or in another manner. In another example, the geographic location may be a geographic location associated with a particular customer (e.g., the customer premises).

In step 206, the FM frequency bands that are used for radio transmission in the geographic location are identified in order to create an interference profile. The interference profile may be considered a preliminary frequency notching profile, as it identifies candidate frequencies at which the G.fast profile may be notched. However, in one example, the G.fast spectrum will not be notched at all of these candidate frequencies, as doing so may limit the bandwidth of the broadband service. Moreover, it may not be necessary to notch the G.fast spectrum at all of the candidate frequencies, as a customer may listen to only a few of the radio stations broadcasting over the candidate frequencies. Thus, in some examples, not all candidate frequencies will become target frequencies.

In one example, these candidate frequencies may be identified by consulting data available from the Federal Communications Commission (FCC) or a similar government organization. For instance, FIG. 3A illustrates an example interference profile 300 showing example FM frequencies used in an example location. The interference profile 300 may identify a particular location (e.g., Location X), as well as the FM frequencies used for radio transmission in the particular location (e.g., 87.5 MHz, 92.3 MHz, . . . , 107.1 MHz). Each of these FM frequencies may be considered a candidate frequency for performing frequency notching. The interference profile 300 may also identify, for each FM frequency, the strength of the signal as detected at the particular location. The strength of the signal may be indicated as one point on a range of points (e.g., very weak, weak, moderate, strong, or very strong), as a number on a defined scale (e.g., on a scale from one to ten, with one indicating a very weak signal and 10 indicating a very strong signal), or in any other manner. In addition, although not illustrated, the interference profile 300 may identify other information associated with each FM frequency, such as the location (e.g., geographic coordinates, town, zip code, etc.) of the broadcast source, the distance (e.g., in miles) from the broadcast source to the particular location, the format (e.g., rock music, news, sports, etc.), educational or other affiliations (e.g., college stations), and/or other information.

Referring back to FIG. 2, in step 208, a survey is performed to determine to which of the candidate frequencies to apply notch filters (e.g., which candidate frequencies will become target frequencies). Thus, the survey helps to narrow the candidate frequencies down to a smaller set of target frequencies to which the notch filters will actually be applied.

In one example, the survey may be an on-site survey of the geographic service area served by the G.fast protocol standard service. This on-site survey may be performed, for example, by a human, a robot, an automated vehicle or the like that is equipped with test equipment to perform an on-site frequency scan of the particular location (e.g., Location X). Data acquired using the test equipment may be used to generate a frequency coverage map that more accurately identifies the strength of the signals broadcast over the candidate frequencies. Thus, the on-site survey may help to more accurately determine which of the candidate frequencies customers at the particular location may actually tune into. For instance, the interference profile may show that a given frequency is used for radio transmission in the particular location, but the on-site survey may indicate that the strength of the radio transmission's signal in the particular location is very weak.

In another example, the survey may be a customer-specific survey. For instance, the candidate frequencies may be presented to each customer at the particular location (e.g., through an online interface), and each customer may be asked to provide selections indicating to which of the candidate frequencies he or she tunes in (or in which the customer has an interest). Alternatively, a tunable frequency/interference detection device may be used to automatically determine to which of the candidate frequencies are available at the customer premises. For instance, the router 108 of FIG. 1 or a residential gateway could be equipped with a tunable receiver that detects which of the candidate frequencies reaches the customer premises. The tunable receiver could be enabled on-demand, or according to a predefined schedule, in order to detect candidate frequencies, but could be disabled at all other times. In one example, the broadband service is disabled when the tunable receiver is enabled.

In step 210, the interference profile is updated based on the results of the survey to create a frequency notching profile. In one example, updating the interference profile involves indicating whether a notch filter will be applied to each of the candidate frequencies identified in step 206. FIG. 3B, for instance, illustrates an example frequency notching profile 302 based on the interference profile 300 illustrated in FIG. 3A. As illustrated, the frequency notching profile 302 may include all or some of the data included in the interference profile 300 (including at least the candidate frequencies). The frequency notching profile 302 may additionally indicate, for each of the candidate frequencies, whether or not to apply a notch filter. The frequency notching profile 302 could be customized for a particular location and/or for a particular customer served by the broadband service.

In one example, where the survey performed in step 208 is an on-site survey of the geographic service area, step 210 may involve deciding to apply a notch filter to any candidate frequency for which the signal strength of the associated radio broadcast transmissions meets or exceeds a predefined threshold (e.g., is at least "moderate" on a scale of "very weak" to "very strong," or is at least 5 on a scale from 1 to 10, etc.).

In another example, where the survey performed in step 208 is a customer-specific survey, step 210 may involve deciding to apply a notch filter to any candidate frequency that the customer has requested be notched or has otherwise indicated an interest in (e.g., any of the candidate frequencies that the customer tunes into).

In optional step 212, the frequency notching profile 302 created in step 210 may be updated based on feedback. For instance, the frequency notching profile 302 created in step 210 could be presented to a customer, and the customer could be asked to verify the selection of the target frequencies to which the notch filters are applied. The feedback may indicate that some existing notch filters should be removed (e.g., the customer no longer tunes into the associated target frequencies), and/or that new notch filters should be applied (e.g., to target frequencies to which the customer tunes in). In one example, step 212 could be performed at any time after the initial creation of the frequency notching profile 302. For instance, as the customer's radio listening habits change, as radio stations change formats, or the like, the customer may wish to make modifications to a customer-specific frequency notching profile. Thus, the customer's frequency notching profile can be dynamically updated at any time (e.g., by accessing an online interface).

The frequency notching profile 302 created in step 210 (and optionally updated in step 212) is stored in step 214 (e.g., in a database, such as the database 130 of FIG. 1), so that it can be used to customize the G.fast spectrum used to deliver broadband service.

The method 200 ends in step 216.

Figure 4:
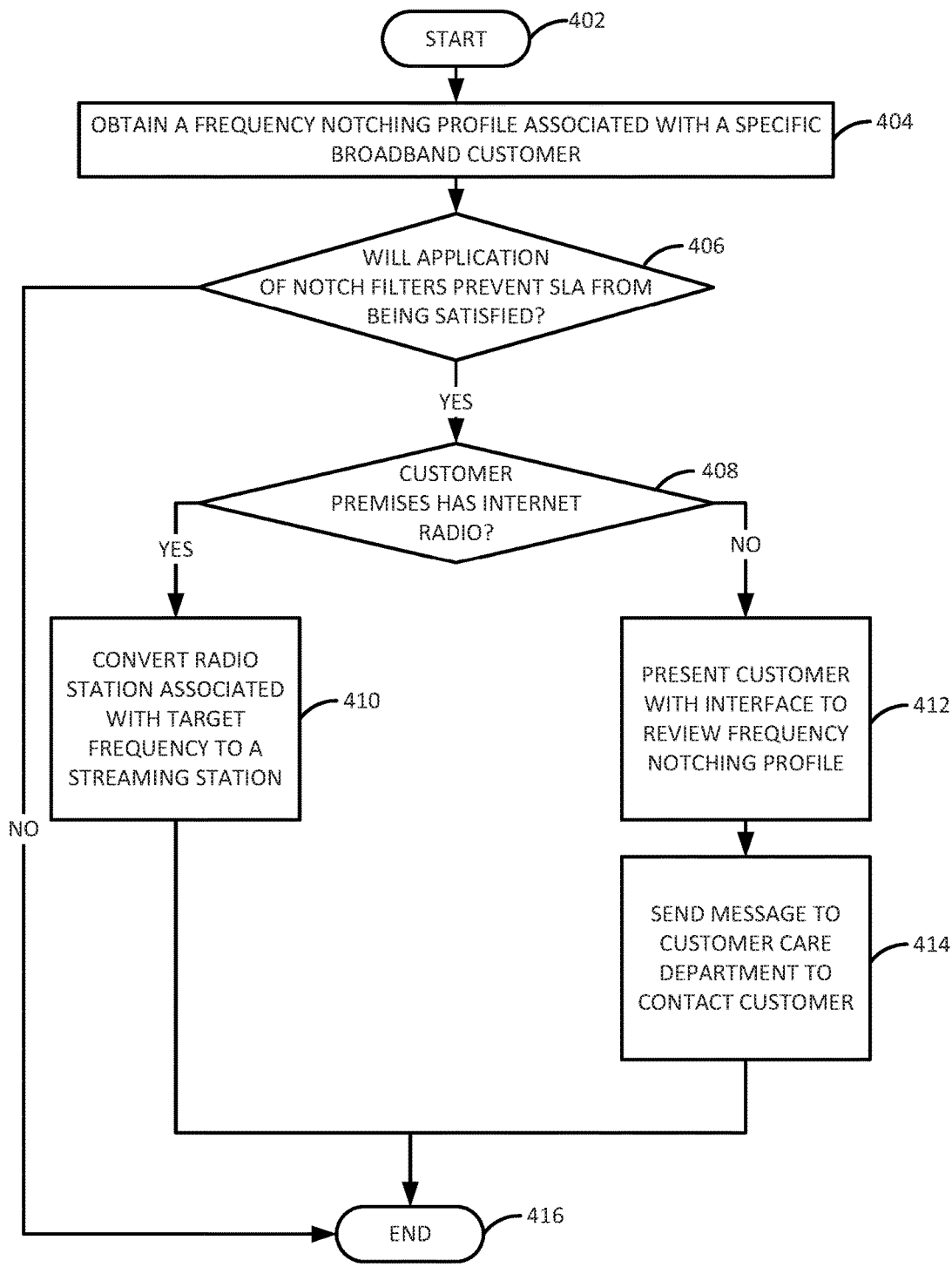
FIG. 4 illustrates a flowchart of an example method for reducing interference on the frequency modulation radio broadcast band from the G.fast protocol standard spectrum.

FIG. 4 illustrates a flowchart of an example method 400 for reducing interference on the frequency modulation (FM) radio broadcast band from the G.fast protocol standard spectrum. In one example, the method 400 may make use of a frequency notching profile created according to the method 200. In one example, the method 400 may be performed by the interference mitigation server 126 and/or additional devices illustrated in FIG. 1. However, in other examples, the method 400 may be performed by another device or devices (e.g., one or more application servers 128 or other device(s)). As such, any references in the discussion of the method 400 to components of FIG. 1 are not intended to limit the means by which the method 400 may be performed.

The method 400 begins in step 402. In step 404, a frequency notching profile associated with a specific broadband customer (or customer premises) is obtained. For instance, the frequency notching profile may be retrieved from a database, such as the database 130 of FIG. 1. The frequency notching profile may identify target frequencies on the FM radio broadcast band to which a notch filter should be applied, e.g., such that the target frequencies are unavailable for use by broadband services such services delivered according to the G.fast protocol standard. The target frequencies may be frequencies that are specified by the customer (e.g., frequencies associated with radio stations to which the customer tunes in), or the target frequencies may be automatically identified in accordance with a local frequency map and/or survey.

In step 406, it is determined whether application of any notch filters indicated by the frequency notching profile will prevent the broadband service provider from being able to deliver the broadband service in a manner that satisfies a service level agreement (SLA). For instance, as discussed above, making frequencies unavailable for use by the broadband service may limit the bandwidth of the broadband service to a point where the SLA cannot be satisfied.

If it is determined in step 406 that application of the notch filters indicated by the frequency notching profile will not prevent the broadband service provider from being able to deliver the broadband service in a manner that satisfies the SLA, then the method 400 ends in step 416.

If, however, it is determined in step 406 that application of the notch filters indicated by the frequency notching profile will prevent the broadband service provider from being able to deliver the broadband service in a manner that satisfies the SLA, then the method 400 proceeds to step 408. In step 408, it is determined whether the customer premises has access to an Internet radio, i.e., a radio device that is capable of receiving both a radio frequency (RF) signal and a wireless fidelity (WiFi) signal. For instance, the home network 132 in FIG. 1 includes an Internet radio 112 that is connected to the Internet 122 via the router 108.

If it is determined in step 408 that the customer premises has access to an Internet radio, then the method 400 proceeds to step 410. In step 410, a radio station associated with a target frequency to which the frequency notching profile indicates that a notch filter should be applied is automatically converted into a streaming (e.g., online) station. Thus, when the customer tunes the radio to the target frequency, the Internet radio will automatically stream the associated radio station over the Internet using the WiFi signal (rather than picking up the RF broadcast). Step 410 may therefore involve configuring the settings of the Internet radio (e.g., either remotely over the Internet, or by sending an instruction to the customer to manually configure the settings) so that the radio station is streamed over the Internet whenever the customer tunes to it.

If, however, it is determined in step 408 that the customer premises does not have access to an Internet radio, then the method 400 proceeds to step 412. In step 412, the customer is presented with an online interface to review the frequency notching profile. This gives the customer that opportunity to confirm that he or she wishes to have notch filters applied to certain FM target frequencies, or to make changes to the frequency notching profile. The interface may advise the customer that application of the currently selected notch filters may negatively affect broadband performance.

In optional step 414, a message may be sent to a customer care department of the broadband service provider instructing a representative from the customer care department to contact the customer. The customer care representative may, for example, reiterate to the customer that application of the notch filters as indicated in the frequency notching profile may negatively affect broadband performance and may provide the customer with options for resolution. For instance, the customer care representative may advise the customer to move his or her radio device away from the residential gateway or other customer premises equipment used to deliver the broadband service. Alternatively, the customer care representative may help the customer to update his or her SLA. As another possibility, the customer care representative may suggest that the customer listen to one or more of the radio stations associated with the notched target frequencies online, e.g., using a PC, a mobile phone, an Internet-ready television, or another Internet-ready device (other than an Internet radio).

The method 400 then ends in step 416.

Although not expressly specified above, one or more steps of the method 200 or 400 may include a storing, displaying and/or outputting step as required for a particular application. In other words, any data, records, fields, and/or intermediate results discussed in the method can be stored, displayed and/or outputted to another device as required for a particular application. Furthermore, operations, steps, or blocks in FIG. 2 or 4 that recite a determining operation or involve a decision do not necessarily require that both branches of the determining operation be practiced. In other words, one of the branches of the determining operation can be deemed as an optional step. Furthermore, operations, steps, or blocks of the above described method(s) can be combined, separated, and/or performed in a different order from that described above, without departing from the examples of the present disclosure.

FIG. 5 depicts a high-level block diagram of a computing device specifically programmed to perform the functions described herein. For example, any one or more components or devices illustrated in FIG. 1 or described in connection with the methods 200 or 400 may be implemented as the system 500. For instance, an interference mitigation server 126 or an application server 128 (such as might be used to perform the method 200 or the method 400) could be implemented as illustrated in FIG. 5.

As depicted in FIG. 5, the system 500 comprises a hardware processor element 502, a memory 504, a module 505 for reducing interference on the frequency modulation (FM) radio broadcast band from the G.fast protocol standard spectrum, and various input/output (I/O) devices 506.

The hardware processor 502 may comprise, for example, a microprocessor, a central processing unit (CPU), or the like. The memory 504 may comprise, for example, random access memory (RAM), read only memory (ROM), a disk drive, an optical drive, a magnetic drive, and/or a Universal Serial Bus (USB) drive. The module 505 for reducing interference on the frequency modulation (FM) radio broadcast band from the G.fast protocol standard spectrum may include circuitry and/or logic for performing special purpose functions relating to creating and/or applying frequency notching profiles for specific customers and/or locations. The input/output devices 506 may include, for example, a camera, a video camera, storage devices (including but not limited to, a tape drive, a floppy drive, a hard disk drive or a compact disk drive), a receiver, a transmitter, a display, an output port, or a user input device (such as a keyboard, a keypad, a mouse, and the like).

Although only one processor element is shown, it should be noted that the general-purpose computer may employ a plurality of processor elements. Furthermore, although only one general-purpose computer is shown in the Figure, if the method(s) as discussed above is implemented in a distributed or parallel manner for a particular illustrative example, i.e., the steps of the above method(s) or the entire method(s) are implemented across multiple or parallel general-purpose computers, then the general-purpose computer of this Figure is intended to represent each of those multiple general-purpose computers. Furthermore, one or more hardware processors can be utilized in supporting a virtualized or shared computing environment. The virtualized computing environment may support one or more virtual machines representing computers, servers, or other computing devices. In such virtualized virtual machines, hardware components such as hardware processors and computer-readable storage devices may be virtualized or logically represented.

It should be noted that the present disclosure can be implemented in software and/or in a combination of software and hardware, e.g., using application specific integrated circuits (ASIC), a programmable logic array (PLA), including a field-programmable gate array (FPGA), or a state machine deployed on a hardware device, a general purpose computer or any other hardware equivalents, e.g., computer readable instructions pertaining to the method(s) discussed above can be used to configure a hardware processor to perform the steps, functions and/or operations of the above disclosed method(s). In one example, instructions and data for the present module or process 505 for reducing interference on the frequency modulation (FM) radio broadcast band from the G.fast protocol standard spectrum (e.g., a software program comprising computer-executable instructions) can be loaded into memory 504 and executed by hardware processor element 502 to implement the steps, functions or operations as discussed above in connection with the example method 200 or the example method 400. Furthermore, when a hardware processor executes instructions to perform "operations," this could include the hardware processor performing the operations directly and/or facilitating, directing, or cooperating with another hardware device or component (e.g., a co-processor and the like) to perform the operations.

The processor executing the computer readable or software instructions relating to the above described method(s) can be perceived as a programmed processor or a specialized processor. As such, the present module 505 for reducing interference on the frequency modulation (FM) radio broadcast band from the G.fast protocol standard spectrum (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

While various examples have been described above, it should be understood that they have been presented by way of example only, and not limitation. Thus, the breadth and scope of a preferred example should not be limited by any of the above-described examples, but should be defined only in accordance with the following claims and their equivalents.

What is claimed is:

1. A method, comprising:
   delivering a broadband service to a customer over a spectrum that overlaps with a frequency modulation radio broadcast band; and
   applying a notch filter to a target frequency of the frequency modulation radio broadcast band based on a profile that is customized for the customer, wherein the notch filter prevents the broadband service from using the target frequency during the delivering, and wherein the profile is alterable by the customer to add or remove the notch filter on-demand.

2. The method of claim 1, wherein the target frequency is used for broadcast by a local radio station into which the customer tunes.

3. The method of claim 1, further comprising:
   creating the profile prior to the delivering.

4. The method of claim 3, wherein the creating comprises:
   identifying a plurality of candidate frequencies to which to apply the notch filter, wherein each candidate frequency of the plurality of candidate frequencies is associated with a respective radio station of a plurality of radio stations that broadcasts radio transmissions in a geographic location associated with the customer, and wherein the plurality of candidate frequencies includes the target frequency; and
   performing a survey to narrow the plurality of candidate frequencies down to a smaller set of frequencies, wherein the smaller set of frequencies includes the target frequency.

5. The method of claim 4, wherein the identifying comprises:
   consulting data available from a federal communications commission.

6. The method of claim 4, wherein the performing comprises:
   detecting, via a tunable receiver at the geographic location, relative strengths of a plurality of signals transmitted over the plurality of candidate frequencies; and
   including, in the smaller set of frequencies, at least one candidate frequency of the plurality of candidate frequencies for which a corresponding relative strength of the relative strengths at least meets a predefined threshold.

7. The method of claim 6, wherein the tunable receiver is deployed in a residential gateway at the geographic location.

8. The method of claim 4, wherein the performing comprises:

presenting, to the customer, the plurality of candidate frequencies via an online interface; and receiving, from the customer, a selection of the target frequency for inclusion in the smaller set of frequencies.

9. The method of claim 4, further comprising:

receiving feedback from the customer regarding the smaller set of frequencies; and updating the profile based on the feedback.

10. The method of claim 1, wherein the spectrum comprises a G.fast protocol standard spectrum.

11. A non-transitory computer-readable medium storing instructions which, when executed by a processor, cause the processor to perform operations, the operations comprising:

delivering a broadband service to a customer over a spectrum that overlaps with a frequency modulation radio broadcast band; and applying a notch filter to a frequency of the frequency modulation radio broadcast band based on a profile that is customized for the customer, wherein the notch filter prevents the broadband service from using the frequency during the delivering, and wherein the profile is alterable by the customer to add or remove the notch filter on-demand.

12. A method, comprising delivering a broadband service to a customer over a spectrum that overlaps with a frequency modulation radio broadcast band;

determining that application of a notch filter to a target frequency of the frequency modulation radio broadcast band will cause the delivering to fail to meet a service level agreement, wherein the notch filter is requested in a profile that is customized for the customer; and automatically streaming a radio station that broadcasts over the target frequency over an internet through an internet-enabled radio when the customer tunes the internet-enabled radio to the target frequency.

13. The method of claim 12, wherein the spectrum comprises a G.fast protocol standard spectrum.

14. The method of claim 12, wherein the profile is alterable by the customer to add or remove the notch filter on-demand.

15. The method of claim 12, further comprising:

creating the profile prior to the delivering.

16. The method of claim 15, wherein the creating comprises:

identifying a plurality of candidate frequencies to which to apply the notch filter, wherein each candidate frequency of the plurality of candidate frequencies is associated with a respective radio station of a plurality of radio stations that broadcasts radio transmissions in a geographic location associated with the customer, and wherein the plurality of candidate frequencies includes the target frequency; and performing a survey to narrow the plurality of candidate frequencies down to a smaller set of frequencies, wherein the smaller set of frequencies includes the target frequency.

17. The method of claim 16, wherein the performing comprises:

detecting, via a tunable receiver at the geographic location, relative strengths of a plurality of signals transmitted over the plurality of candidate frequencies; and including, in the smaller set of frequencies, at least one candidate frequency of the plurality of candidate frequencies for which a corresponding relative strength of the relative strengths at least meets a predefined threshold.

18. The method of claim 17, wherein the tunable receiver is deployed in a residential gateway at the geographic location.

19. The method of claim 16, wherein the performing comprises:

presenting, to the customer, the plurality of candidate frequencies via an online interface; and receiving, from the customer, a selection of the target frequency for inclusion in the smaller set of frequencies.

20. The method of claim 16, further comprising:

receiving feedback from the customer regarding the smaller set of frequencies; and updating the profile based on the feedback.

* * * * *